(12) United States Patent
Bai et al.

(10) Patent No.: US 10,847,732 B2
(45) Date of Patent: Nov. 24, 2020

(54) MANUFACTURING METHOD OF FLEXIBLE DISPLAY PANEL AND FLEXIBLE DISPLAY PANEL

(71) Applicant: Wuhan China Star Optoelectronics Semiconductor Display Technology Co., Ltd., Wuhan (CN)

(72) Inventors: Sihang Bai, Wuhan (CN); Junyan Hu, Wuhan (CN); Guochao Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 171 days.

(21) Appl. No.: 16/326,371

(22) PCT Filed: Nov. 19, 2018

(86) PCT No.: PCT/CN2018/116107
§ 371 (c)(1),
(2) Date: Feb. 19, 2019

(87) PCT Pub. No.: WO2020/029464
PCT Pub. Date: Feb. 13, 2020

(65) Prior Publication Data
US 2020/0161570 A1    May 21, 2020

(30) Foreign Application Priority Data

Aug. 6, 2018 (CN) .......................... 2018 1 0882764

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3246* (2013.01); *H01L 27/3248* (2013.01);
(Continued)

(58) Field of Classification Search
CPC ....................... H01L 51/0097; H01L 27/3246
See application file for complete search history.

(56) References Cited

U.S. PATENT DOCUMENTS

2017/0186777 A1* 6/2017 Toyotaka ............ H01L 27/1225
2017/0186829 A1* 6/2017 Yamazaki ........... H01L 51/0024
2019/0131368 A1   5/2019 Zhang et al.

FOREIGN PATENT DOCUMENTS

CN       107564941       1/2018
CN       107658333       2/2018
(Continued)

*Primary Examiner* — Mohammad M Choudhry

(57) ABSTRACT

A manufacturing method of a flexible display panel and the flexible display panel are provided in the present disclosure. The flexible display panel includes a flexible substrate, a blocking layer, a buffering layer, an active layer, a first gate electrode insulating layer, a first gate electrode metal layer, a second gate electrode insulating layer, a second gate electrode metal layer, an organic interlayer insulating layer, a source/drain electrode metal layer, a passivation layer, an anode metal layer, a pixel isolation layer, and a pixel support layer. The source/drain electrode metal layer is connected to the active layer and the second gate electrode metal layer through two through holes.

11 Claims, 4 Drawing Sheets

(51) Int. Cl.
*H01L 51/56* (2006.01)
*H01L 27/12* (2006.01)
*H01L 29/49* (2006.01)

(52) U.S. Cl.
CPC ...... *H01L 27/3258* (2013.01); *H01L 27/3262* (2013.01); *H01L 51/003* (2013.01); *H01L 51/56* (2013.01); *H01L 27/1218* (2013.01); *H01L 27/1248* (2013.01); *H01L 27/1266* (2013.01); *H01L 27/1288* (2013.01); *H01L 29/4908* (2013.01); *H01L 2227/323* (2013.01); *H01L 2227/326* (2013.01); *H01L 2251/5338* (2013.01)

(56) References Cited

FOREIGN PATENT DOCUMENTS

| | | |
|---|---|---|
| CN | 107706224 | 2/2018 |
| CN | 107910335 | 4/2018 |
| JP | 2005-072144 | 3/2005 |

* cited by examiner

```
                ┌─────────────────────────────────────────────────┐
                │ providing a substrate and developing a flexible substrate on a surface │
                │ of the substrate; next sequentially developing a blocking layer and a │
                │ buffering layer on a surface of the flexible substrate; then developing an │
                │ active layer on a surface of the buffering layer; after that, developing on │
                │ the surface of the buffering layer a first gate electrode insulating layer │── S10
                │ which completely covers the active layer; afterward, developing a first │
                │ gate electrode metal layer on a surface of the first gate electrode │
                │ insulating layer, developing on the first gate electrode insulating layer a │
                │ second gate electrode insulating layer which completely covers the first │
                │ gate electrode metal layer, and developing a second gate electrode │
                │ metal layer on the second gate electrode insulating layer │
                └─────────────────────────────────────────────────┘
                                          │
                                          ▼
                ┌─────────────────────────────────────────────────┐
                │ dry etching through a mask on the blocking layer, the buffering layer, │
                │ the second gate electrode insulating layer, and the first gate electrode │── S20
                │ insulating layer to define a channel in a non-display area, wherein the │
                │ channel exposes the flexible substrate │
                └─────────────────────────────────────────────────┘
                                          │
                                          ▼
                ┌─────────────────────────────────────────────────┐
                │ developing on a surface of the second gate electrode insulating layer an │
                │ organic interlayer insulating layer which completely covers the second │
                │ gate electrode metal layer and fills the channel, and defining a first │── S30
                │ through hole and a second through hole by etching the organic │
                │ interlayer insulating layer, wherein the second gate electrode insulating │
                │ layer is exposed from the first through hole, and the second gate │
                │ electrode metal layer is exposed from the second through hole │
                └─────────────────────────────────────────────────┘
                                          │
                                          ▼
                ┌─────────────────────────────────────────────────┐
                │ etching through the first through hole the first gate electrode insulating │
                │ layer and the second gate electrode insulating layer by using the │── S40
                │ organic interlayer insulating layer as a mask to define a third through │
                │ hole which exposes the active layer │
                └─────────────────────────────────────────────────┘
                                          │
                                          ▼
                ┌─────────────────────────────────────────────────┐
                │ developing a source/drain electrode metal layer on a surface of the │
                │ organic interlayer insulating layer; next developing on the surface of │
                │ the organic interlayer insulating layer a passivation layer which │
                │ completely covers the source/drain electrode metal layer; then on a │── S50
                │ surface of the passivation layer sequentially developing an anode metal │
                │ layer, a pixel isolation layer and a pixel support layer, wherein a │
                │ portion of the anode metal layer is directly connected to the source/ │
                │ drain electrode metal layer; finally, removing the substrate │
                └─────────────────────────────────────────────────┘
```

FIG. 1

MANUFACTURING METHOD OF FLEXIBLE DISPLAY PANEL AND FLEXIBLE DISPLAY PANEL

RELATED APPLICATIONS

This application is a National Phase of PCT Patent Application No. PCT/CN2018/116107 having International filing date of Nov. 19, 2018, which claims the benefit of priority of Chinese Patent Application No. 201810882764.6 filed on Aug. 6, 2018. The contents of the above applications are all incorporated by reference as if fully set forth herein in their entirety.

FIELD AND BACKGROUND OF THE INVENTION

The present invention relates to a field of display device techniques and in particular, to a manufacturing method of a flexible display panel and to the flexible display panel.

At present, flexible display devices have the advantages of lightness, thinness, flexibility, impact resistance, and excellent waterproof performance, and are widely used in wearable devices and in the field of some special function display devices. In order to realize a narrow bezel design of small-sized mobile phones for obtaining a larger screen ratio of the mobile phone, a conventional technology of bending a flexible back plate backwards is utilized. In this technology, a fastening structure of the soft film packaging technology or a fastening structure of an integrated circuit of a chip on the flexible substrate, and the data signal wires connected to a pixel circuit in a display area and some testing circuit area are together bent below a display panel, so that a lower side of a bezel of the rigid display panel can be made smaller. In a conventional flexible display panel, a portion of an inorganic film layer in the display area is removed to fill in an organic material, thereby reducing a stress of the organic film layer. An ISO (insulation layer structure) design is introduced into the structure, and consequently, an interlayer insulating layer with higher stress can release its stress during bending, which facilitates bending and stability of the flexible display panel.

However, this design has its drawbacks. First of all, a high-pixel 7T1C (seven n-channel TFTs and one storage capacitor) structure has limited space for the ISO design, so less ISO structures can be introduced, and as a result, the stress release is insufficient. Secondly, the display area adopts an organic interlayer insulating layer structure, so a through hole of an organic layer interlayer insulating layer needs to be defined in a position corresponding to a position of a through hole of the interlayer insulating layer. Due to this limitation, a diameter of the through hole of the organic interlayer insulating layer needs to be greater than a diameter of the through hole of the interlayer insulating layer, which significantly limits the development of high pixel designs. It is therefore necessary to create new structures to satisfy the bending requirement of the display area.

In summary, in the conventional flexible display panel, the organic interlayer insulating layer and the interlayer insulating layer overlap each other, so the diameter of the through hole of the organic interlayer insulating layer needs to be greater than the diameter of the through hole of the interlayer insulating layer, thus significantly limiting development in high pixel techniques.

SUMMARY OF THE INVENTION

The present invention provides a flexible display panel capable of avoiding a large through hole design of an organic interlayer insulating layer to thereby solve the existing problems in a conventional flexible display panel. In the conventional flexible display panel, an organic interlayer insulating layer and an interlayer insulating layer overlap each other, so a through hole of the organic interlayer insulating layer needs to be larger than a through hole of the interlayer insulating layer, thus significantly limiting development in high pixel techniques.

In solution, the present invention provides a manufacturing method of a flexible display panel, including steps as follows.

S10: providing a substrate and developing a flexible substrate on a surface of the substrate; next sequentially developing a blocking layer and a buffering layer on a surface of the flexible substrate; then developing an active layer on a surface of the buffering layer; after that, developing on the surface of the buffering layer a first gate electrode insulating layer which completely covers the active layer; afterward, developing a first gate electrode metal layer on a surface of the first gate electrode insulating layer, developing on the first gate electrode insulating layer a second gate electrode insulating layer which completely covers the first gate electrode metal layer, and developing a second gate electrode metal layer on the second gate electrode insulating layer;

S20: dry etching through a mask on the blocking layer, the buffering layer, the second gate electrode insulating layer, and the first gate electrode insulating layer to define a channel in a non-display area, wherein the channel exposes the flexible substrate;

S30: developing on a surface of the second gate electrode insulating layer an organic interlayer insulating layer which completely covers the second gate electrode metal layer and fills the channel, and defining a first through hole and a second through hole by etching the organic interlayer insulating layer, wherein the second gate electrode insulating layer is exposed from the first through hole, and the second gate electrode metal layer is exposed from the second through hole;

S40: etching through the first through hole the first gate electrode insulating layer and the second gate electrode insulating layer by using the organic interlayer insulating layer as a mask to define a third through hole which exposes the active layer; and S50: developing a source/drain electrode metal layer on a surface of the organic interlayer insulating layer; next developing on the surface of the organic interlayer insulating layer a passivation layer which completely covers the source/drain electrode metal layer; then on a surface of the passivation layer sequentially developing an anode metal layer, a pixel isolation layer and a pixel support layer, wherein a portion of the anode metal layer is directly connected to the source/drain electrode metal layer; finally, removing the substrate.

In the manufacturing method of the flexible display panel according to one embodiment of the present invention, the channel penetrates the second gate electrode insulating layer, the first gate electrode insulating layer, the buffering layer, and the blocking layer, and stops at the flexible substrate.

In the manufacturing method of the flexible display panel according to one embodiment of the present invention, the organic interlayer insulating layer is made of an organic photoresist material.

In the manufacturing method of the flexible display panel according to one embodiment of the present invention, step S40 includes:

S401: performing a baking process on the organic interlayer insulating layer;

S402: dry etching through the first through hole, without being exposed to light, the first gate electrode insulating layer and the second gate electrode insulating layer by using the processed organic interlayer insulating layer as the mask; and S403: defining the third through hole which exposes the active layer.

In the manufacturing method of the flexible display panel according to one embodiment of the present invention, the third through hole penetrates the organic interlayer insulating layer, the second gate electrode insulating layer and the first gate electrode insulating layer, and stops at the active layer.

In the manufacturing method of the flexible display panel according to one embodiment of the present invention, the flexible substrate is made of polyimide or polyethylene terephthalate, and the buffering layer is made of one or both of silicon nitride and silicon oxide.

In the manufacturing method of the flexible display panel according to one embodiment of the present invention, the first gate electrode insulating layer is made of silicon nitride or silicon oxide, and the second gate electrode insulating layer is made of a material the same as the material for making the first gate electrode insulating layer.

In the manufacturing method of the flexible display panel according to one embodiment of the present invention, the first gate electrode is made of molybdenum, and a thickness of the first gate electrode is greater than a sum of a thickness of the first gate electrode insulating layer and a thickness of the second gate electrode insulating layer.

In the manufacturing method of the flexible display panel according to one embodiment of the present invention, an organic material is deposited on a surface of the pixel isolation layer to form an organic light emitting layer, and the organic light emitting layer comprises a planarization layer, the pixel isolation layer and an organic light-emitting diode (OLED) pixel layer which overlap each other.

The present invention provides a flexible display panel. The flexible display panel comprises a flexible substrate, a blocking layer, a buffering layer, an active layer, a first gate electrode insulating layer, a first gate electrode metal layer, a second gate electrode insulating layer, a second gate electrode metal layer, an organic interlayer insulating layer, a source/drain electrode metal layer, a passivation layer, an anode metal layer, a pixel isolation layer, and a pixel support layer. The organic interlayer insulating layer is disposed on a surface of the second gate electrode insulating layer and covers the second gate electrode metal layer. The organic interlayer insulating layer in a portion of a non-display area penetrates the second gate electrode insulating layer, the first gate electrode insulating layer, the buffering layer, and the blocking layer, and the organic interlayer insulating layer is connected to the flexible substrate. A first through hole and a second through hole are defined in the organic interlayer insulating layer, the source/drain electrode metal layer is connected to the active layer through the first through hole, and the source/drain electrode metal layer is connected to the second gate electrode metal layer through the second through hole.

The advantages of the present application are as follows. In the manufacturing method of the flexible display substrate and the flexible display panel provided by the present application, the organic interlayer insulating layer replaces the inorganic interlayer insulating layer, thereby avoiding a large through hole design of the organic interlayer insulating layer, thus realizing a high pixel design of the flexible display panel and reducing costs of the masks and materials.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

FIG. 1 is a process flow diagram illustrating a manufacturing method of a flexible display panel according to the present invention;

DETAILED DESCRIPTION OF SPECIFIC EMBODIMENTS OF THE INVENTION

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

The present application aims to solve an existing problem in conventional flexible display panels. In the conventional flexible display panel, since an interlayer insulating layer and an organic interlayer insulating layer overlap each other, a through hole of the organic interlayer insulating layer needs to be larger than a through hole of the interlayer insulating layer, thus inhibiting development in high pixel design of the flexible display panel. The present invention can solve the above-mentioned problem.

In order to solve the above-mentioned problem, the present invention provides a manufacturing method of a flexible display panel, as shown in FIG. 1. The manufacturing method of the flexible display panel includes:

S10: providing a substrate and developing a flexible substrate on a surface of the substrate; next sequentially developing a blocking layer and a buffering layer on a surface of the flexible substrate; then developing an active layer on a surface of the buffering layer; after that, developing on the surface of the buffering layer a first gate electrode insulating layer which completely covers the active layer; afterward, developing a first gate electrode metal layer on a surface of the first gate electrode insulating layer, developing on the first gate electrode insulating layer a second gate electrode insulating layer which completely covers the first gate electrode metal layer, and developing a second gate electrode metal layer on the second gate electrode insulating layer.

Figure 1A:
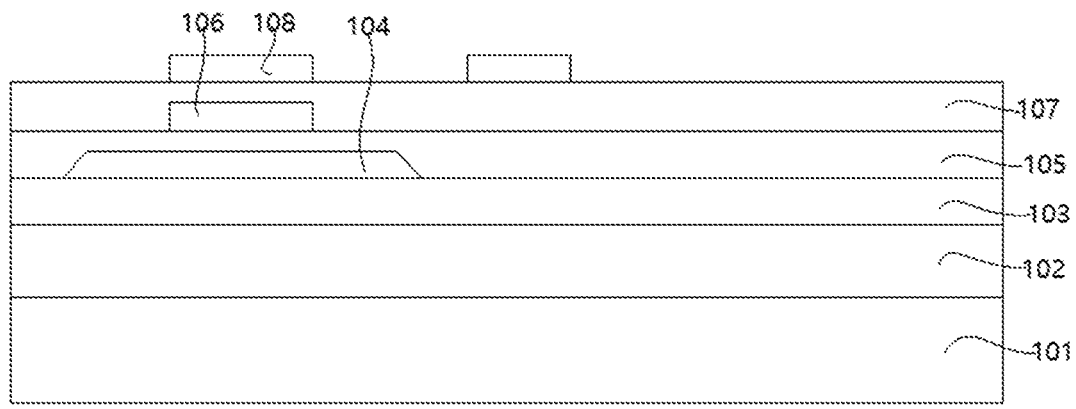
FIGS. 1A, 1B, 1C, 1D and 1E are schematic views illustrating the manufacturing method of the flexible display panel.

Referring to FIG. 1A, in detail, step S10 includes:

First, providing an insulation substrate and depositing a flexible substrate 101 on a surface of the substrate, wherein the flexible substrate 101 is made of polyimide or polyethylene terephthalate; next, sequentially depositing a blocking layer 102 and a buffering layer 103 on a surface of the flexible substrate 101 by physical vapor deposition, wherein the blocking layer 102 is made of one or both of silicon nitride and silicon oxide, a thickness of the blocking layer 102 is 5000 Å, the buffering layer 103 is made of one or both of the silicon nitride and silicon oxide, a thickness of the buffering layer 103 is 3000 Å; then developing an active layer 104 by forming a semiconductor layer on a surface of the buffering layer 103 and performing a photomask lithography process to define a semiconductor layer structure; after that, depositing on the surface of the buffering layer 103 a first gate electrode insulating layer 105 which completely covers the active layer 104, wherein the first gate electrode insulating layer 105 is made of silicon nitride or silicon oxide, and a thickness of the first gate electrode insulating layer 105 is 1000 Å; afterward, developing a first gate electrode metal layer 106 by performing a photomask lithography process on a surface of the first gate electrode insulating layer 105 to define a gate electrode conductive structure, wherein the first gate electrode metal layer is made of molybdenum, and a thickness of the first gate electrode metal layer 106 is 2500 Å; thereafter, depositing on the first gate electrode insulating layer 105 a second gate electrode insulating layer 107, the second gate electrode insulating layer 107 is made of a material the same as the material for making the first gate electrode insulating layer 105, a thickness of the second gate electrode insulating layer 107 is 1200 Å; finally, developing a second gate electrode metal layer 108 by performing a photomask lithography process on the second gate electrode insulating layer 107 to define a gate electrode conductive structure, wherein the second gate electrode metal layer is made of molybdenum.

S20: dry etching through a mask on the blocking layer, the buffering layer, the second gate electrode insulating layer, and the first gate electrode insulating layer to define a channel in a non-display area, wherein the channel exposes the flexible substrate.

Figure 1B:
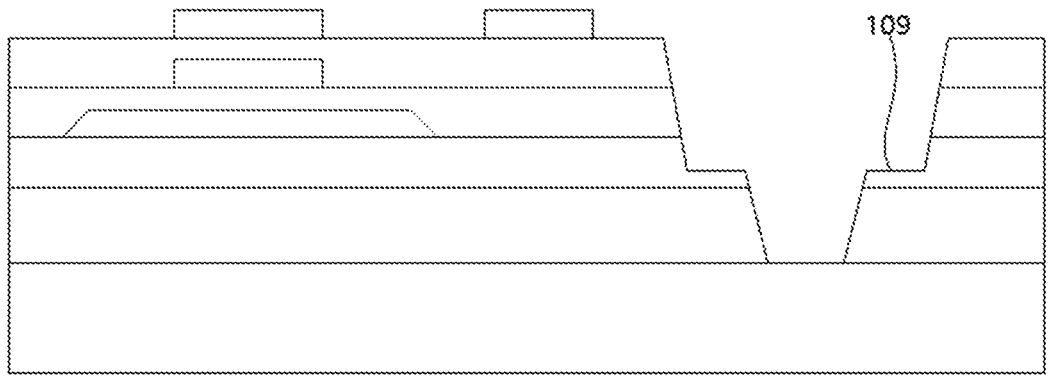

In detail, step S20 includes:

First, dry etching through a mask on the blocking layer 102, the buffering layer 103, the second gate electrode insulating layer 107, and the first gate electrode insulating layer 105 to define a channel 109 in the non-display area, wherein the channel 109 exposes the flexible substrate 101, the channel 109 penetrates the second gate electrode insulating layer 107, the first gate electrode insulating layer 105, the buffering layer 103, and the blocking layer 102, and stops at the flexible substrate 101, as shown in FIG. 1B.

S30: developing on a surface of the second gate electrode insulating layer an organic interlayer insulating layer which completely covers the second gate electrode metal layer and fills the channel, and defining a first through hole and a second through hole by etching the organic interlayer insulating layer, wherein the second gate electrode insulating layer is exposed from the first through hole, and the second gate electrode metal layer is exposed from the second through hole.

Figure 1C:
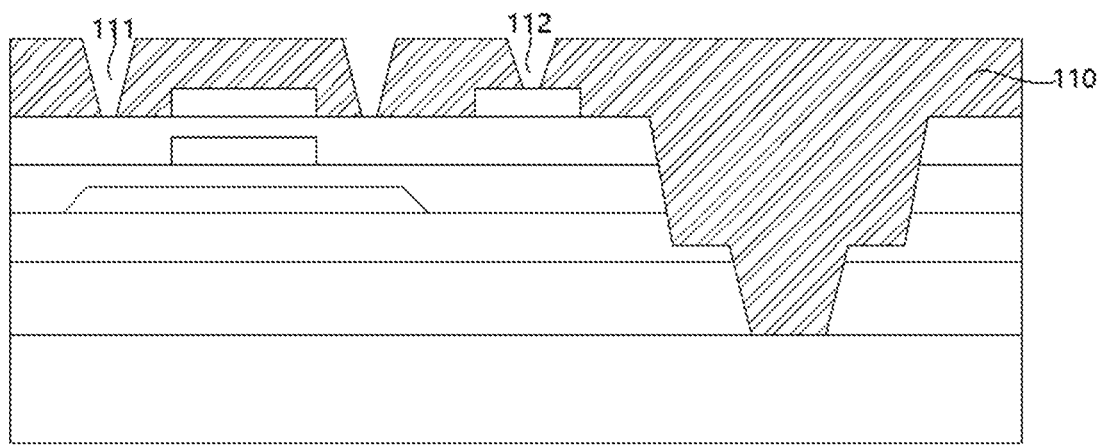

In detail, step S30 includes:

First, developing on a surface of the second gate electrode insulating layer 107 an organic interlayer insulating layer 110 which completely covers the second gate electrode metal layer 108 and fills the channel 109, wherein the organic interlayer insulating layer 110 is made of an organic photoresist material; and defining a first through hole 111 and a second through hole 112 by etching the organic interlayer insulating layer 110, wherein there are a total of two first through holes 111 and only one second through hole 112 defined in the organic interlayer insulating layer 110, the first through hole 111 penetrates the organic interlayer insulating layer 110 and stops at the second gate electrode insulating layer 107, and the second through hole 112 penetrates the organic interlayer insulating layer 110 and stops at the second gate electrode metal layer 108, as shown in FIG. 1C.

S40: etching through the first through hole the first gate electrode insulating layer and the second gate electrode insulating layer by using the organic interlayer insulating layer as a mask to define a third through hole which exposes the active layer.

Figure 1D:
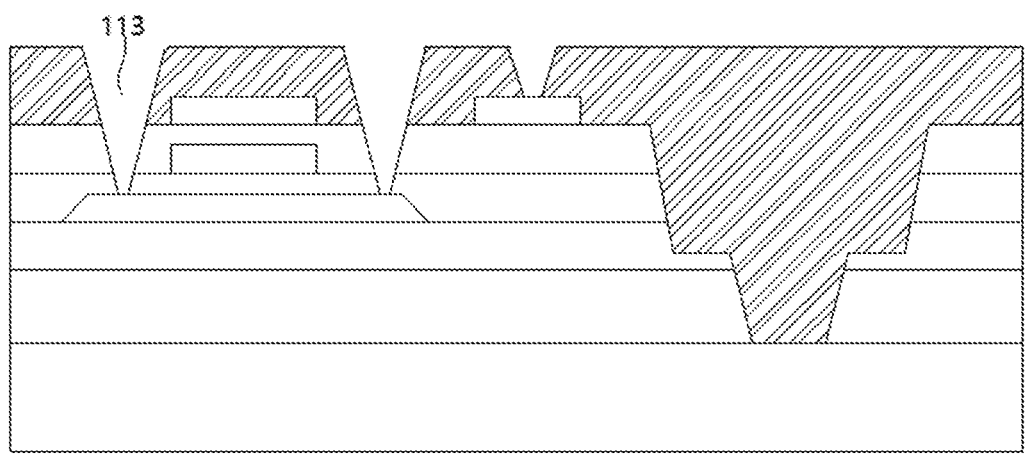

In detail, step S40 includes:

First, performing a baking process on the organic interlayer insulating layer 110; then dry etching through the first through hole 111, without being exposed to light, the first gate electrode insulating layer 105 and the second gate electrode insulating layer 107 by using the processed organic interlayer insulating layer as a mask; and finally, defining the third through hole 113, wherein a total of two third through holes 113 are defined, and the third through hole 113 penetrates the organic interlayer insulating layer 110, the second gate electrode insulating layer 107 and the first gate electrode insulating layer 105, and stops at the active layer 104, as shown in FIG. 1D.

S50: developing a source/drain electrode metal layer on a surface of the organic interlayer insulating layer; next developing on the surface of the organic interlayer insulating layer a passivation layer which completely covers the source/drain electrode metal layer; then, on a surface of the passivation layer sequentially developing an anode metal layer, a pixel isolation layer and a pixel support layer, wherein a portion of the anode metal layer is directly connected to the source/drain electrode metal layer; finally, removing the substrate.

Figure 1E:
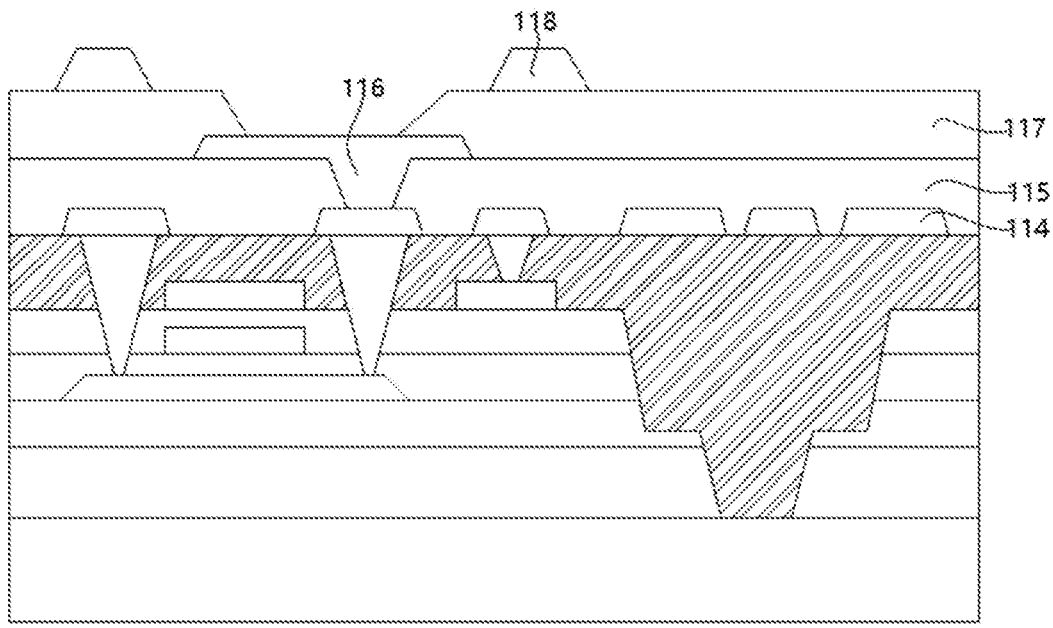

In detail, step S50 includes:

Developing a source/drain electrode metal layer 114 by forming a metal layer on a surface of the organic interlayer insulating layer 110 and performing a photomask lithography process to define a source/drain electrode conductive structure, wherein the source/drain electrode metal layer 114 is made of titanium or aluminum, a thickness of the source/drain electrode metal layer 114 is 7600 Å, a plurality of signal wires pass through the third through holes 113 to connect the source/drain electrode metal layer 114 to the active layer 104, and a plurality of signal wires pass through the second through holes 112 to connect the source/drain electrode metal layer 114 to the second gate electrode metal layer 108; next, developing on the surface of the organic interlayer insulating layer 110 a passivation layer 115 which completely covers the source/drain electrode metal layer 114; then, on a surface of the passivation layer sequentially depositing an anode metal layer 116, a pixel isolation layer 117 and a pixel support layer 118, wherein a portion of the anode metal layer 116 is directly connected to the source/drain electrode metal layer 114; finally, depositing an organic material on a surface of the pixel isolation layer to form an organic light emitting layer which consists of a planarization layer, the pixel isolation layer and an organic light-emitting diode (OLED) pixel player overlapping each other, and removing the substrate, as shown in FIG. 1E.

Figure 2:
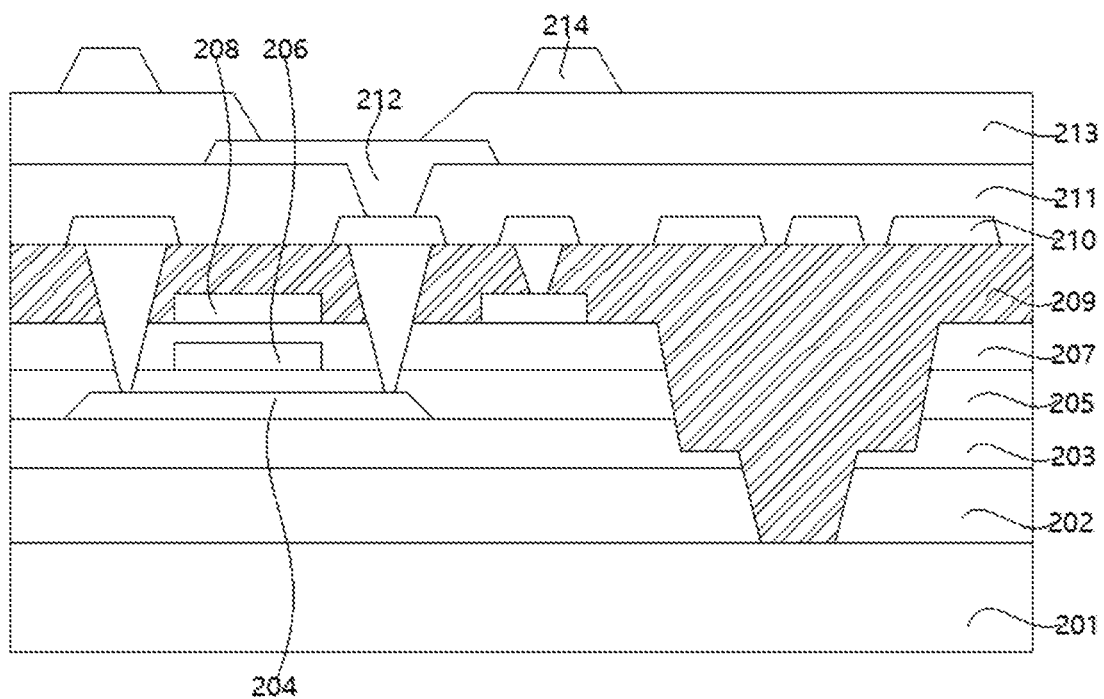
FIG. 2 is a schematic structural view illustrating the flexible display panel.

Referring to FIG. 2, the present invention provides a flexible display panel. The flexible display panel includes:

a flexible substrate 201;

a blocking layer 202 disposed on a surface of the flexible substrate 201;

a buffering layer 203 disposed on a surface of the blocking layer 202;

an active layer 204 disposed on a surface of the buffering layer 203;

a first gate electrode insulating layer 205 disposed on the surface of the buffering layer 203 and covering the active layer 204;

a first gate electrode metal layer 206 disposed on a surface of the first gate electrode insulating layer 205;

a second gate electrode insulating layer 207 disposed on the surface of the first gate electrode insulating layer 205 and covering the first gate electrode metal layer 206;

a second gate electrode metal layer 208 disposed on a surface of the second gate electrode insulating layer 207;

an organic interlayer insulating layer 209, the organic interlayer insulating layer 209 being disposed on the surface of the second gate electrode insulating layer 207 and covering the second gate electrode metal layer 208, the organic interlayer insulating layer 209 in a portion of a non-display area penetrating the second gate electrode insulating layer 207, the first gate electrode insulating layer 205, the buffering layer 203, and the blocking layer 202, the organic interlayer insulating layer 209 being connected to the flexible substrate 201;

a source/drain electrode metal layer 210 disposed on a surface of the organic interlayer insulating layer 209;

a passivation layer 211 disposed on the surface of the organic interlayer insulating layer 211 and covering the source/drain electrode metal layer 210;

an anode metal layer 212 disposed on a surface of the passivation layer 211;

a pixel isolation layer 213 disposed on the surface of the passivation layer 211 and covering two end edges of the anode metal layer 212; and a pixel support layer 214 disposed on a surface of the pixel isolation layer 213;

wherein a first through hole and a second through hole are defined in the organic interlayer insulating layer 209, the source/drain electrode metal layer 210 is connected to the active layer 204 through the first through hole, and the source/drain electrode metal layer 210 is connected to the second gate electrode metal layer 208 through the second through hole.

The advantages of the present application are as follows. In the manufacturing method of the flexible display substrate and the flexible display panel provided by the present application, the organic interlayer insulating layer replaces the inorganic interlayer insulating layer, thereby avoiding a large through hole design of the organic interlayer insulating layer, thus realizing a high pixel design of the flexible display panel and reducing costs of the masks and materials.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A manufacturing method of a flexible display panel, comprising steps as follows:
    S10: providing a substrate and developing a flexible substrate on a surface of the substrate; next sequentially developing a blocking layer and a buffering layer on a surface of the flexible substrate; then developing an active layer on a surface of the buffering layer; after that, developing on the surface of the buffering layer a first gate electrode insulating layer which completely covers the active layer; afterward, developing a first gate electrode metal layer on a surface of the first gate electrode insulating layer, developing on the first gate electrode insulating layer a second gate electrode insulating layer which completely covers the first gate electrode metal layer, and developing a second gate electrode metal layer on the second gate electrode insulating layer;
    S20: dry etching through a mask on the blocking layer, the buffering layer, the second gate electrode insulating layer, and the first gate electrode insulating layer to define a channel in a non-display area, wherein the channel exposes the flexible substrate;
    S30: developing on a surface of the second gate electrode insulating layer an organic interlayer insulating layer which completely covers the second gate electrode metal layer and fills the channel, and defining a first through hole and a second through hole by etching the organic interlayer insulating layer, wherein the second gate electrode insulating layer is exposed from the first through hole, and the second gate electrode metal layer is exposed from the second through hole;
    S40: etching through the first through hole the first gate electrode insulating layer and the second gate electrode insulating layer by using the organic interlayer insulating layer as a mask to define a third through hole which exposes the active layer; and
    S50: developing a source/drain electrode metal layer on a surface of the organic interlayer insulating layer; next developing on the surface of the organic interlayer insulating layer a passivation layer which completely covers the source/drain electrode metal layer; then on a surface of the passivation layer sequentially developing an anode metal layer, a pixel isolation layer and a pixel support layer, wherein a portion of the anode metal layer is directly connected to the source/drain electrode metal layer; finally, removing the substrate.

2. The manufacturing method of the flexible display panel according to claim 1, wherein the channel penetrates the second gate electrode insulating layer, the first gate electrode insulating layer, the buffering layer, and the blocking layer, and stops at the flexible substrate.

3. The manufacturing method of the flexible display panel according to claim 1, wherein the organic interlayer insulating layer is made of an organic photoresist material.

4. The manufacturing method of the flexible display panel according to claim 1, wherein step S40 comprises:
    S401: performing a baking process on the organic interlayer insulating layer;
    S402: dry etching through the first through hole, without being exposed to light, the first gate electrode insulating layer and the second gate electrode insulating layer by using the processed organic interlayer insulating layer as the mask; and
    S403: defining the third through hole which exposes the active layer.

5. The manufacturing method of the flexible display panel according to claim 4, wherein the third through hole penetrates the organic interlayer insulating layer, the second gate electrode insulating layer and the first gate electrode insulating layer, and stops at the active layer.

6. The manufacturing method of the flexible display panel according to claim 1, wherein the flexible substrate is made of polyimide or polyethylene terephthalate, and the buffering layer is made of one or both of silicon nitride and silicon oxide.

7. The manufacturing method of the flexible display panel according to claim 1, wherein the first gate electrode insulating layer is made of silicon nitride or silicon oxide, and the second gate electrode insulating layer is made of a material the same as the material for making the first gate electrode insulating layer.

8. The manufacturing method of the flexible display panel according to claim 1, wherein the first gate electrode is made of molybdenum, a thickness of the first gate electrode is greater than a sum of a thickness of the first gate electrode insulating layer and a thickness of the second gate electrode insulating layer.

9. The manufacturing method of the flexible display panel according to claim 8, wherein an organic material is deposited on a surface of the pixel isolation layer to form an organic light emitting layer, and the organic light emitting layer comprises a planarization layer, the pixel isolation layer and an organic light-emitting diode (OLED) pixel layer which overlap each other.

10. A flexible display panel manufactured by the manufacturing method of claim 1, the flexible display panel comprising:
    a flexible substrate;
    a blocking layer disposed on a surface of the flexible substrate;
    a buffering layer disposed on a surface of the blocking layer;
    an active layer disposed on a surface of the buffering layer;
    a first gate electrode insulating layer disposed on the surface of the buffering layer and covering the active layer;
    a first gate electrode metal layer disposed on a surface of the first gate electrode insulating layer;
    a second gate electrode insulating layer disposed on the surface of the first gate electrode insulating layer and covering the first gate electrode metal layer;
    a second gate electrode metal layer disposed on a surface of the second gate electrode insulating layer;
    an organic interlayer insulating layer, the organic interlayer insulating layer being disposed on the surface of the second gate electrode insulating layer and covering the second gate electrode metal layer, the organic interlayer insulating layer in a portion of a non-display area penetrating the second gate electrode insulating layer, the first gate electrode insulating layer, the buffering layer, and the blocking layer, the organic interlayer insulating layer being connected to the flexible substrate;
    a source/drain electrode metal layer disposed on a surface of the organic interlayer insulating layer;
    a passivation layer disposed on the surface of the organic interlayer insulating layer and covering the source/drain electrode metal layer;
    an anode metal layer disposed on a surface of the passivation layer;
    a pixel isolation layer disposed on the surface of the passivation layer and covering two end edges of the anode metal layer; and
    a pixel support layer disposed on a surface of the pixel isolation layer;
    wherein a first through hole and a second through hole are defined in the organic interlayer insulating layer, the source/drain electrode metal layer is connected to the active layer through the first through hole, and the source/drain electrode metal layer is connected to the second gate electrode metal layer through the second through hole.

11. A flexible display panel manufactured by the manufacturing method of claim 4, the flexible display panel comprising:
    a flexible substrate;
    a blocking layer disposed on a surface of the flexible substrate;
    a buffering layer disposed on a surface of the blocking layer;
    an active layer disposed on a surface of the buffering layer;
    a first gate electrode insulating layer disposed on the surface of the buffering layer and covering the active layer;
    a first gate electrode metal layer disposed on a surface of the first gate electrode insulating layer;
    a second gate electrode insulating layer disposed on the surface of the first gate electrode insulating layer and covering the first gate electrode metal layer;
    a second gate electrode metal layer disposed on a surface of the second gate electrode insulating layer;
    an organic interlayer insulating layer, the organic interlayer insulating layer being disposed on the surface of the second gate electrode insulating layer and covering the second gate electrode metal layer, the organic interlayer insulating layer in a portion of a non-display area penetrating the second gate electrode insulating layer, the first gate electrode insulating layer, the buffering layer, and the blocking layer, the organic interlayer insulating layer being connected to the flexible substrate;
    a source/drain electrode metal layer disposed on a surface of the organic interlayer insulating layer;
    a passivation layer disposed on the surface of the organic interlayer insulating layer and covering the source/drain electrode metal layer;
    an anode metal layer disposed on a surface of the passivation layer;
    a pixel isolation layer disposed on the surface of the passivation layer and covering two end edges of the anode metal layer; and
    a pixel support layer disposed on a surface of the pixel isolation layer;
    wherein a first through hole and a second through hole are defined in the organic interlayer insulating layer, the source/drain electrode metal layer is connected to the active layer through the first through hole, and the source/drain electrode metal layer is connected to the second gate electrode metal layer through the second through hole.

* * * * *